(12) United States Patent
Adelmann

(10) Patent No.: US 6,862,211 B2
(45) Date of Patent: Mar. 1, 2005

(54) MAGNETO-RESISTIVE MEMORY DEVICE

(75) Inventor: Todd C. Adelmann, Boise, ID (US)

(73) Assignee: Hewlett-Packard Development Company, Houston, TX (US)

( * ) Notice: Subject to any disclaimer, the term of this patent is extended or adjusted under 35 U.S.C. 154(b) by 0 days.

(21) Appl. No.: 10/614,230

(22) Filed: Jul. 7, 2003

(65) Prior Publication Data

US 2005/0007815 A1 Jan. 13, 2005

(51) Int. Cl.$^7$ .............................................. G11C 11/14
(52) U.S. Cl. .................. 365/158; 365/171; 365/189.07
(58) Field of Search ................................. 365/158, 171, 365/189.09, 207, 209

(56) References Cited

U.S. PATENT DOCUMENTS

| | | | |
|---|---|---|---|
| 5,699,293 A | 12/1997 | Tehrani et al. | |
| 5,936,882 A | 8/1999 | Dunn | |
| 6,034,887 A | 3/2000 | Gupta et al. | |
| 6,205,052 B1 | 3/2001 | Slaughter et al. | |
| 6,341,084 B2 | 1/2002 | Numata et al. | |
| 6,366,494 B2 | 4/2002 | Weber et al. | |
| 6,396,733 B1 | 5/2002 | Lu et al. | |
| 6,424,564 B2 | 7/2002 | Li et al. | |
| 6,473,336 B1 * | 10/2002 | Nakajima et al. | 365/171 |
| 6,501,686 B2 | 12/2002 | Boehm et al. | |

OTHER PUBLICATIONS

Butner, Richard, "Computing Unplugged: Magnetic RAM cures your computer of short–term memory loss", http://www.research.ibm.com/thinkresearch/pages/2001/20010202_mram.shtml, 4 pgs.

Daughton, James, "Magnetoresistive Random Access Memory (MRAM)", http://www.nve.com/otherbiz/mram.pdf ,Copyright © Feb. 4, 2000, 13 pgs.

Geppert, Linda, "The New Indelible Memories: It's a three–way race in the multibillion–dollar memory sweepstakes", http://www.spectrum.ieee.org/WEBONLY/publicfeature/mar03/semi.html, Feb. 28, 2003, 10 pgs.

* cited by examiner

*Primary Examiner*—David Lam

(57) ABSTRACT

A memory array for a magneto-resistive memory device is provided. The array includes a plurality of memory cells disposed in rows and columns in the memory array. Each memory cell is paired with another memory cell such that the pair of memory cells are driven to first and second, different states by the same signals. A sense point for reading data from a pair of memory cells is also provided. The sense point is located at a point with one of the memory cells of each pair on one side of the sense point and the other memory cell of each pair located on the other side of the sense point.

18 Claims, 5 Drawing Sheets

MAGNETO-RESISTIVE MEMORY DEVICE

BACKGROUND

Electronic systems have become a ubiquitous fixture in modern society. These electronic systems range from simple, hand-held calculators to more complex systems including computers, personal digital assistants (PDAs), embedded controllers and complex satellite imaging and communications systems. Many electronic systems include a microprocessor that performs one or more functions based on data provided to the microprocessor. This data is typically stored in a memory device of the electronic system such as a common dynamic random access memory (DRAM) device.

A DRAM typically includes an array of memory cells that store data as binary values, e.g., 1's and 0's. In a conventional DRAM, the data is stored by controlling the charge on capacitors in each cell of the DRAM. Data in the array is "randomly accessible" since a processor can retrieve data from any location in memory by providing the appropriate address to the memory device.

One problem with conventional DRAM is that the device is "volatile." This means that when power is turned off to the system using the DRAM, the data in the memory device is lost.

Non-volatile memory devices exist and are also in wide use today. One type of non-volatile memory is referred to as Flash memory. Flash memory is commonly used in many applications like cell phones, PDAs, and the like. Conventional Flash memory store data on "floating gates." When power is removed from the electronic system, the floating gates retain their current charge so that data is not lost when power is removed.

Conventional Flash technology is not without problems. One problem with Flash memory is the speed of operation. Flash memory is much slower than conventional DRAM. Conventional DRAM cells can write data in a fews tens of nanoseconds whereas Flash cells can take at least a microsecond to write the same data. Thus, Flash cells are hundreds of times slower than comparable DRAM cells. When millions of bits are being stored, this timing can produce significant delays. Further, Flash memory cells begin to break down much more quickly than DRAM cells.

Researchers have been working on developing a new non-volatile memory referred to as magneto-resistive random access memory (MRAM). Unlike conventional DRAM, which uses electrical cells (e.g., capacitors) to store data, MRAM uses magnetic cells. Because magnetic memory cells maintain their state even when power is removed, MRAM possesses a distinct advantage over electrical cells.

In one form of MRAM technology, two small magnetic layers separated by a thin insulating layer typically make up each memory cell, forming a tiny magnetic "sandwich." Each magnetic layer behaves like a tiny bar magnet, with a north pole and south pole, called a magnetic "moment." The moments of the two magnetic layers can be aligned either parallel (north poles pointing in the same direction) or antiparallel (north poles pointing in opposite directions) to each other. These two states correspond to the binary states—the 1's and 0's—of the memory. The memory writing process aligns the magnetic moments, while the memory reading process detects the alignment.

In MRAM technology, data is read from a memory cell by determining the orientation of the magnetic moments in the two layers of magnetic material in the cell. Passing a small electric current directly through the memory cell accomplishes this: when the moments are parallel, the resistance of the memory cell is smaller than when the moments are not parallel. Even though there is an insulating layer between the magnetic layers, the insulating layer is so thin that electrons can "tunnel" through the insulating layer from one magnetic layer to the other.

To write to an MRAM cell, currents pass through wires close to (but not connected to) the magnetic cell. Because any current through a wire generates a magnetic field, this field can change the direction of the magnetic moment of the magnetic material in the magnetic cell. The arrangement of the wires and cells is called a cross-point architecture: the magnetic junctions are set up along the intersection points of a grid. Word lines run in parallel on one side of the magnetic cells. Bit lines runs on a side of the magnetic cells opposite the word lines. The bit lines are perpendicular to the set of word lines below. Like coordinates on a map, choosing one particular word line and one particular bit line uniquely specifies one of the memory cells. To write to a particular cell (bit), a current is passed through the word line and bit line that intersect at that particular cell. Only the cell at the crosspoint of the word line and the bit line sees the magnetic fields from both currents and changes state.

One difficulty with reading data from an MRAM cell is a small difference in resistance exists between the two logic states of the cell. In some cases, this small difference in resistance makes it difficult to reliably read data from the cell. Thus, there is a need in the art for an improved technique for reading data from an MRAM cell.

SUMMARY

The above mentioned problems with magneto-resistive memory devices and other problems are addressed by embodiments of the present invention and will be understood by reading and studying the following specification.

In one embodiment, a memory array for a magneto-resistive memory device is provided. The array includes a plurality of memory cells disposed in rows and columns in the memory array. Each memory cell is paired with another memory cell such that the pair of memory cells are driven to first and second, different states by the same signals. A sense point for reading data from a pair of memory cells is also provided. The sense point is located at a point with one of the memory cells of each pair on one side of the sense point and the other memory cell of each pair located on the other side of the sense point.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
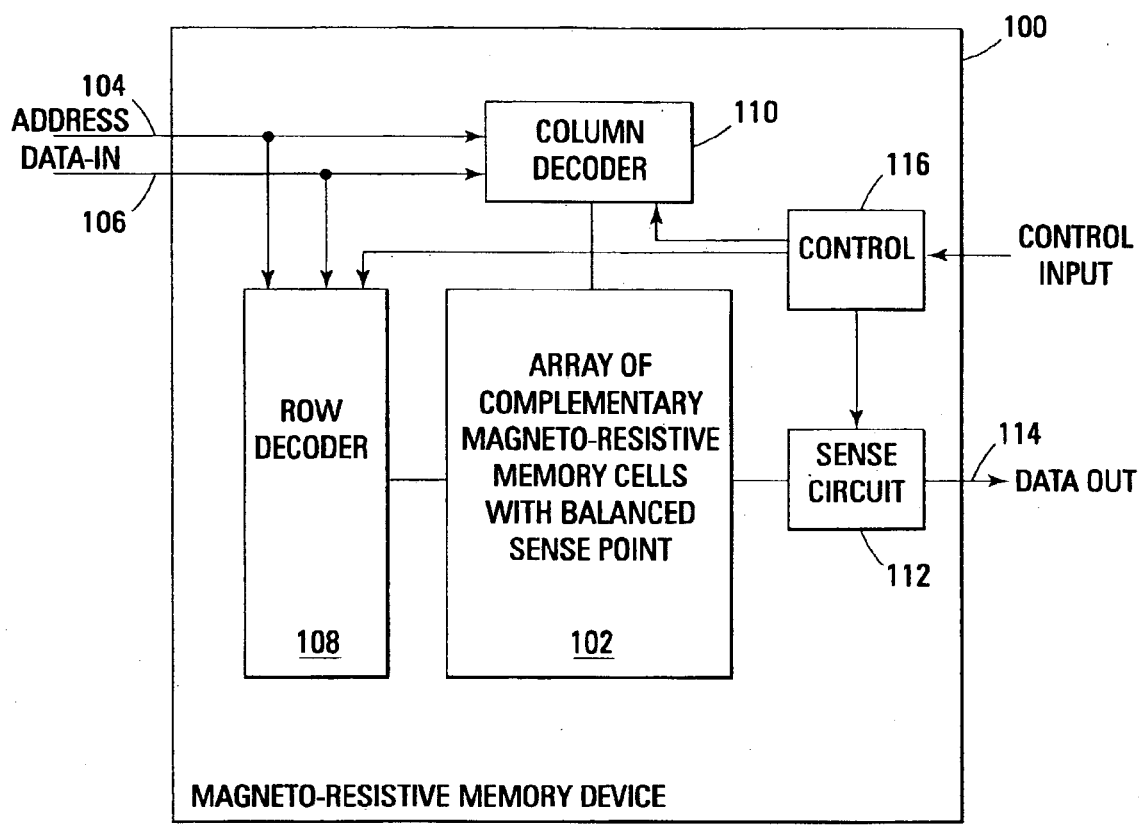
FIG. 1 is block diagram of a memory circuit that includes an array of complementary cells with a balanced sense scheme according to one embodiment of the present invention.

FIG. 1 is block diagram of a memory circuit or memory device, indicated generally at 100, that includes an array 102 of complementary cells with a balanced sense scheme according to one embodiment of the present invention. For purposes of this specification, the term "complementary cells" means that each bit of data is stored using two cells of array 102 by changing the state of each cell. In one embodiment, this change in state comprises changing the states of each cell in complementary or opposing directions. For example, when a first logic value is to be stored in array 102, the resistance of one cell is increased and the resistance of a complementary cell is decreased thereby providing twice the change in resistance from the original states of the two cells. When a low logic value is to be stored, the resistance of each complementary cell is driven in the opposite direction. In one embodiment, the resistance is changed by changing the magnetic moment of the memory cells. In one embodiment, array 102 of FIG. 1 is constructed as described below with respect to the embodiments of FIGS. 2–4.

Array 102 includes a plurality of magneto-resistive memory cells that are disposed in a plurality of rows and a plurality of columns. The memory cells of array 102 store each bit as complementary values on a pair of memory cells in array 102. In one embodiment, complementary cells are set to complementary values using the same signals to set each cell. Further, array 102 provides a "balanced" sense point for reading data from array 102. A "balanced" sense point is a point on a sense line that is between the complementary cells being read to produce an output for the array 102. In one embodiment, each row of the array includes one sense point located substantially at a midpoint of the row.

Memory circuit 100 provides random access to data stored in the complementary memory cells of array 102. Memory circuit 100 receives inputs and produces outputs in providing random access to data in array 102. On the input side, memory circuit 100 receives an ADDRESS signal at input 104. The ADDRESS signal identifies at least one selected memory cell in array 102 to be written to or read from. Further, memory circuit 100 also receives a DATA-IN signal at input 106. The DATA-IN signal includes data to be written to the identified cell(s) in array 102, when present.

Memory circuit 100 also includes row decoder 108 and column decoder 110. Row decoder 108 and column decoder 110 are also coupled to array 102. Row decoder 108 and column decoder 110 work together to provide access to the memory cell(s) in array 102 based on the ADDRESS signal received at input 104. Row decoder 108 and column decoder 110 include circuitry that provides signals to array 102 to store data in, and retrieve data from, the selected memory cell(s).

Memory circuit 100 also includes control circuit 116. Control circuit 116 is coupled to provide control signals to column decoder 110, row decoder 108 and to sense circuit 112. Control circuit 116 provides appropriate control signals to control aspects of data storage and retrieval, e.g., timing and other signals. Control circuit 116 also is adapted to receive control signals, CONTROL INPUT, from a processor, e.g., processor 602 of FIG. 6.

Memory circuit 100 includes sense circuit 112. Sense circuit 112 is coupled to array 102 and outputs data during a read operation. Sense circuit 112 is coupled to output port 114 as signal DATA OUT. In one embodiment, sense circuit 112 is constructed according one of the embodiments shown and described in co-pending application Ser. No. 10/614,581, filed on Jul. 7, 2003, entitled: Memory Cell Strings In A Resistive Cross Point Memory Cell Array, (the '506 application). The '506 application is incorporated herein by reference.

In operation, memory circuit 100 provides random access to a plurality of memory cells in array 102 for storage and retrieval of data. In a write operation, data is received at input 106, e.g., from a processor such as processor 602 of FIG. 6, along with an address for storing the data at input 104. Row decoder 108 and column decoder 10 generate signals for array 102 to store the data in the location identified by the address. In one embodiment, the data is stored as complementary values on two, complementary memory cells in array 102 using the same signals to store both values. In reading data, memory circuit 100 receives the location of the requested data as an address at input 104. Row decoder 108 and column decoder 110 provide signals to array 102 to access the data. Sense circuit 112 senses the value of the data stored at the selected address based on the states of two, complementary memory cells. This value is provided at output 1114. The DATA IN, DATA OUT and sometimes even the ADDRESS functions can be multiplexed onto the same lines.

Figure 2:
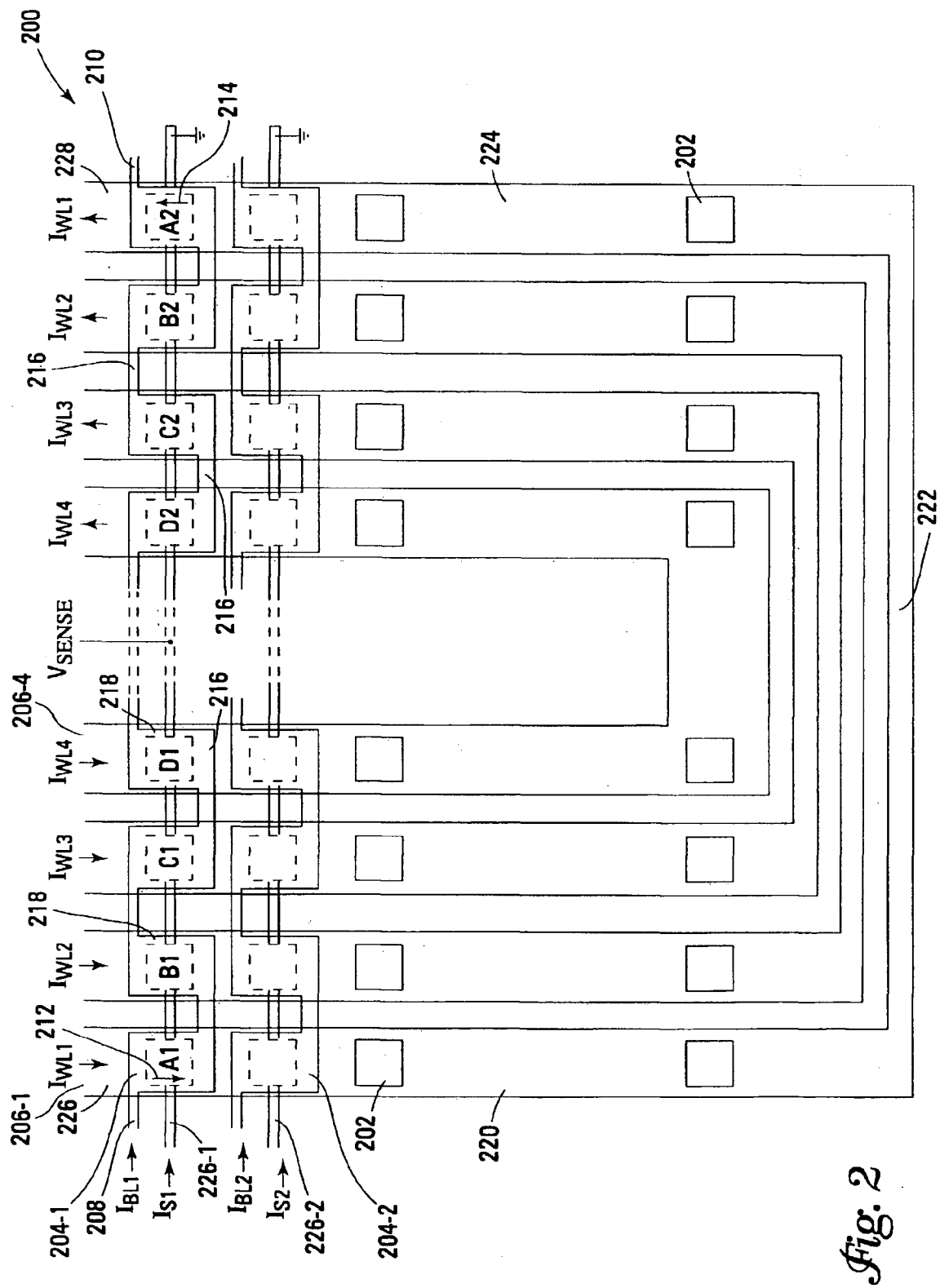
FIG. 2 is top view of an array of complementary memory cells according to one embodiment of the present invention.

FIG. 2 is top view of an array of complementary memory cells, indicated generally at 200, according to one embodiment of the present invention. Array 200 includes a plurality of magneto-resistive memory cells 202 that are disposed to form a matrix with a plurality of rows and a plurality of columns. A bit line, e.g., bit line 204-1, passes adjacent to one side of each memory cell 202 in a given row of array 200. Similarly, a word line, e.g., word line 206-1, passes adjacent to memory cells in a given column of array 200. In one embodiment, word lines and bit lines are disposed in planes on opposite sides of the memory cells. In other embodiments, the word lines and bit lines are disposed in planes on the same side of the memory cells. Thus, memory cells are disposed between word lines and bit lines at their intersections such that the bit lines and word line provide random access to the memory cells 202.

Memory cells 202 in array 200 are accessible in complementary pairs such that each value, e.g., bit, stored in array 200 is stored using two memory cells 202. In one embodiment, each of the memory cells 202 in a complementary pair are located on the same row of array 200 and are on opposite sides of a sense point labeled $V_{SENSE}$ in FIG. 2.

The bit lines of array 200 are represented by bit lines 204-1 and 204-2 in FIG. 2. For sake of simplicity and clarity in FIG. 2, only two bit lines are shown. It is understood, however, that in a given implementation of an array of memory cells, one bit line is used for each row of memory cells. It is further understood that any appropriate number of rows of memory cells can be included in array 200. Due to the common features of each bit line, only bit line 204-1 is described in detail. It is understood that the remaining bit lines are constructed and operate in a similar manner.

Bit line 204-1 is a serpentine bit line. Bit line 204-1 passes adjacent to memory cells 202 labeled as memory cells A1, B1, C1, D1, D2, C2, B2, and A2, respectively in array 200. With this nomenclature, memory cells in a complementary pair are identified with a common letter, e.g., A1 and A2 are a complementary pair, such that this row is shown to include 4 complementary pairs. Serpentine bit line 204-1 passes adjacent to each member of a complementary pair such that current flows in bit line 204-1 in substantially opposite directions at the two memory cells of the pair. For example, when current flows in bit line 204-1 from end 208 to end 210, current flows in the direction of arrow 212 at cell A1 and in the opposite direction as indicated by arrow 214 at cell A2. This layout of bit line 204-1 allows cells A1 and A2 to be set to opposite values using the same signal, e.g., the current applied to bit line 204-1 along with the associated current of word line 206-1.

Figure 7:
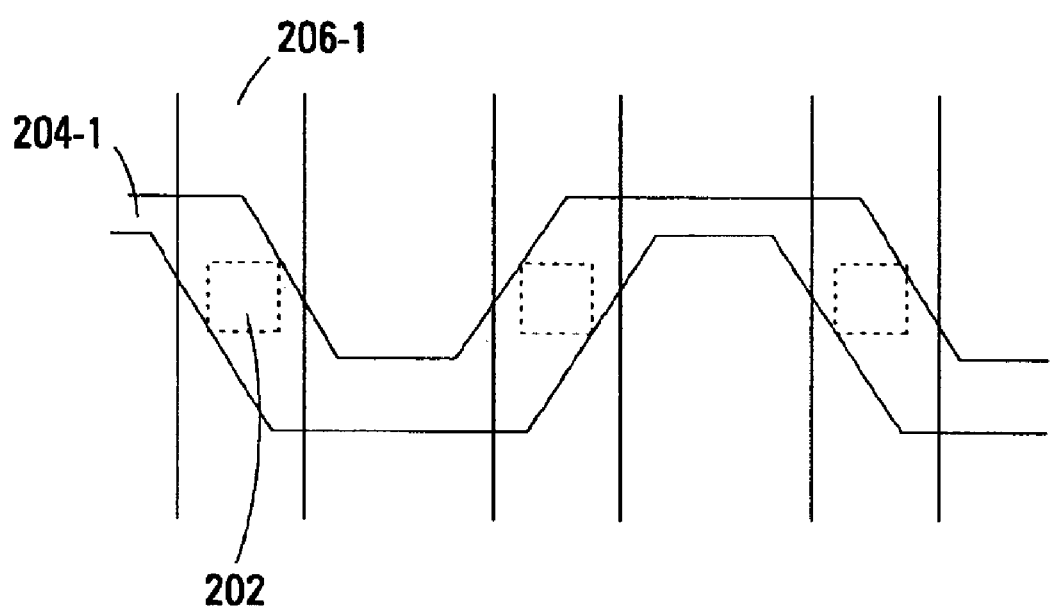
FIG. 7 is a top view of an alternate embodiment for the arrangement of the bit lines of a memory array.

In one embodiment, serpentine bit line 204-1 includes a plurality of first portions 216 that run parallel to the rows of array 202 and a plurality of second portions 218 that run parallel to the columns of array 202. The second portions 218 are coupled to adjacent ones of the first portions 216 such that current in the serpentine bit line 204-1 flows in substantially opposite directions for adjacent memory cells in the row of the array 200. In another embodiment, illustrated in FIG. 7, bit lines 204-1 include second portions 218 that include an angular offset with respect to the associated word lines. In this embodiment, the direction of the current in the serpentine bit line 204-1 flows in first and second, different directions for complementary memory cells such that the states of the complementary memory cells are changed in opposite directions by the same current applied to bit line 204-1.

Memory array 200 also includes a plurality of word lines represented by word lines 206-1, . . . , 206-4. As with the bit lines, an implementation of array 200 includes any appropriate number of word lines. Word line 206-1 is described in detail. Word line 206-1 passes adjacent to memory cells in two columns of array 200. Word line 206-1 includes a first portion 220 that passes adjacent to memory cells 202 in one column of array 200. Word line 206-1 includes a second portion 224 that passes adjacent to a second column of memory cells. Further, first and second portions 220 and 224 are interconnected by a third portion 222 to form a word line 206-1 that is substantially U-shaped. With this shape, current traveling from end 226 to end 228 of word line 206-1 passes in different directions in first and second portions 220 and 224. In one embodiment, the different directions are substantially opposite directions.

Figure 3:
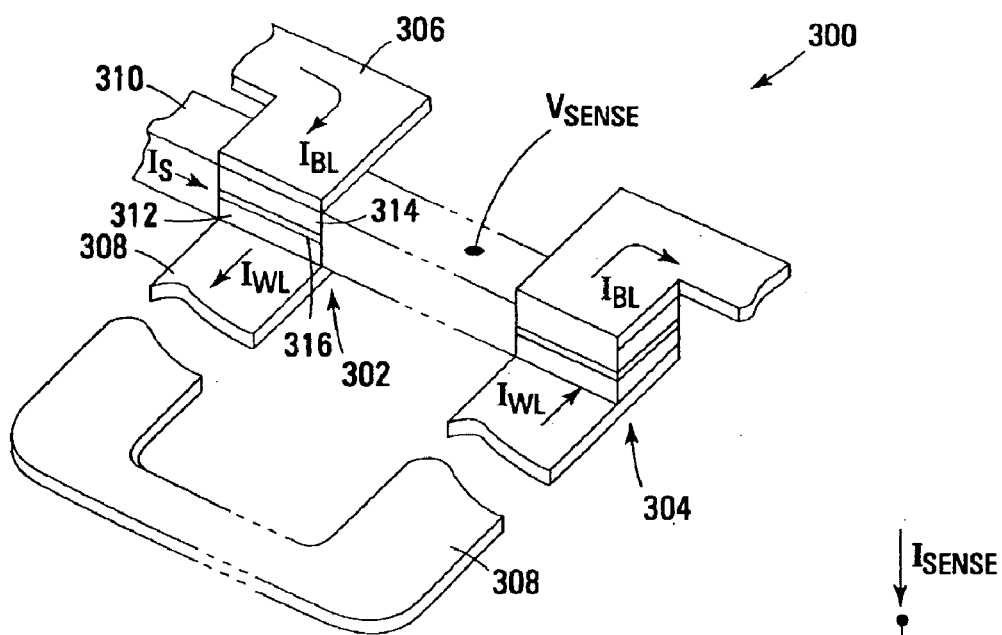
FIG. 3 is a perspective view of a pair of complementary memory cells according to one embodiment of the present invention.

Memory array 200 also includes sense lines represented by sense lines 226-1 and 226-2. Memory array 200 includes one sense line per row of array 200. As shown in FIG. 3, these sense lines interconnect the memory cells in the row and lie between the word lines and bit lines. The word lines, bit lines and portions of the sense lines between memory cells each are fabricated from conductive material.

In operation, array 200 provides random access for storage and retrieval of data in magneto-resistive memory cells. In a write operation, a pair of memory cells is selected based on an address provided with the data to receive the data. The data, e.g., either binary 1 or 0, is written as complementary values to the memory cells by providing an appropriate current signal to the word line and the bit line that intersect at the memory cells targeted for storing the data. By providing the appropriate currents on the bit and word lines, the magnetic moment of the associated memory cells are set to the correct orientation. For example, a data value of 1 is stored in memory cells A1 and A2 by providing a current on word line 206-1 and a current on bit line 204-1. The effective resistance of memory cells A1 and A2 are driven in opposite directions under the influence of these currents since the currents passing memory cell A1 in word line 206-1 and bit line 204-1 are substantially opposite to the directions of the currents in word line 206-1 and bit line 204-1, respectively, when passing memory cell A2.

Figure 4:
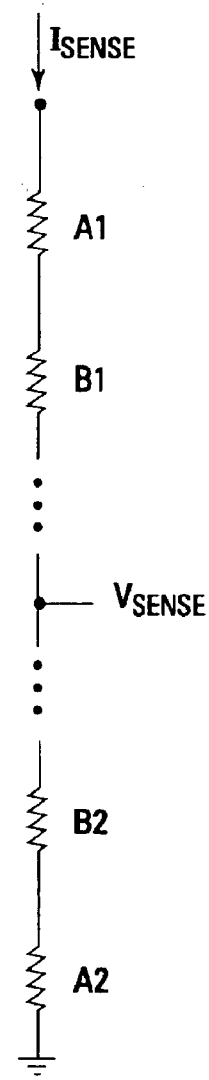
FIG. 4 is a schematic representation of one row of memory cells in an array of complementary memory cells according to one embodiment of the present invention.
Figure 5:
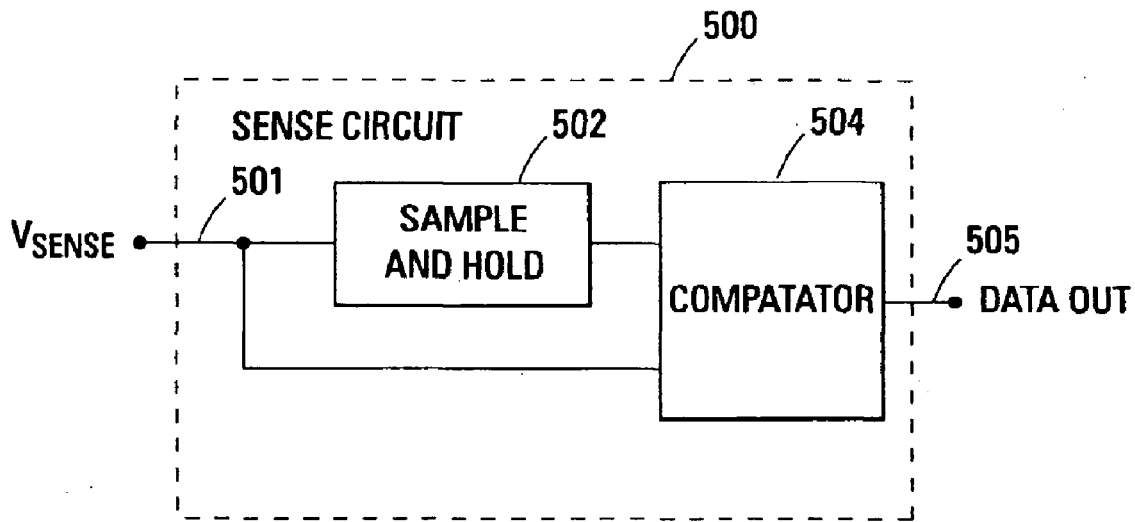
FIG. 5 is a block diagram of a sense circuit for use with an array of complementary memory cells according to one embodiment of the present invention.

When reading data, a current is passed through a sense line associated with the memory cells storing the desired data. For example, when the data stored in memory cells A1 and A2 is to be read, a current is passed through sense line 226-1. The value of the data is determined based on the voltage at sense point $V_{SENSE}$. As shown in FIG. 4, each memory cell acts as a resistive component in a chain of resistors. Thus, the row of memory cells functions as a voltage divider at the sense point $V_{SENSE}$. The value stored in the memory cells, e.g., cells A1 and A2, is determined based on the voltage read at the sense point $V_{SENSE}$. For example, when A1 and A2 store a high logic value, the resistance of cell A1 is increased and the resistance of cell A2 is decreased. Thus, the voltage at $V_{SENSE}$ is reduced. This reduced voltage indicates a high logic value is stored in the cells. In other embodiments, a high logic value is reflected by an increase in the voltage level of $V_{SENSE}$. FIG. 5 provides one example of a technique for reading data from the memory cells based on the output $V_{SENSE}$. Further, the '506 application provides examples of circuitry used to read data from the memory cells.

FIG. 3 is a perspective view of a portion of a memory array, indicated generally at 300, including pair of complementary memory cells 302 and 304 according to one embodiment of the present invention. Portions of the memory array 300 have been removed to show the structure and orientation of memory cells 302 and 304. Memory array 300 includes serpentine bit line 306 that passes adjacent to both memory cells 302 and 304. Further, array 300 also includes word line 308 that also passes adjacent to memory cells 302 and 304 on a side opposite to serpentine bit line 306. Memory cells 302 and 304 are interconnected with other memory cells (not shown) by sense line 310.

Each memory cell 302 and 304 includes three layers of material. Due to the similarities between memory cells, only memory cell 302 is described in detail. Memory cell 302 includes first and second magnetic layers 312 and 314, respectively, separated by an insulating layer 316. In one embodiment, the state of each memory cell is determined by setting the magnetic moment of one of layers 312 and 314. The other layer is maintained with a preset magnetic orientation. In other embodiments, the memory cells are constructed according to other known or later developed structures.

In operation, the state of memory cells 302 and 304 is set based on current signals provided on bit line 306 and word line 308. When data is written, currents passing through bit line 306 and word line 308 provide sufficient magnetic fields in the vicinity of memory cells 302 and 304 to set the magnetic moments of the cells to selected orientations. When set, the effective resistance of memory cells 302 and 304 are driven in different, e.g., substantially opposite, directions due to the orientation of the current flows in word line 308 and bit line 306 at the two memory cells. When reading data from memory cells 302 and 304, current is passed through the cells along the sense line 310 interconnecting the cells. A voltage is read at sense point $V_{SENSE}$.

FIG. 5 is a block diagram of a sense circuit, indicated generally at 500, for use with an array of complementary memory cells according to one embodiment of the present invention. Sense circuit 500 includes input 501 that is adapted to receive an input from an array of memory cells, e.g., from sense point $V_{SENSE}$ of a sense line of array 200 of FIG. 2. Sense circuit 500 includes sample and hold circuit 502 and comparator 504. Input 501 is provided to both sample and hold circuit 502 and comparator 504. Further, sample and hold circuit 502 is coupled to another input of comparator 504. Comparator 504 provides an output 505 for sense circuit 500.

In operation, sense circuit 500 uses a destructive read operation to read the value represented by a pair of complementary cells. The read operation is accomplished in a two step process. First, the voltage at the sense point, $V_{SENSE}$, is read. This value is then stored while a known value is written to the complementary cells. The cell is then read again. The value of the data stored in the complementary cells is determined based on whether the $V_{SENSE}$ value changed due to the writing of the known data value. Once read, the original value is written back to the complementary cells.

The method thus begins with receiving a first value at input 501 from a sense point $V_{SENSE}$ of an array. In one embodiment, this value corresponds to a set value for a pair of complementary cells in the associated array. This value is sampled and held in sample and hold circuit 502. A known data value is then written to the same complementary cells in the memory array. The value of $V_{SENSE}$ is then provided to input 501 and compared with the previous value by comparator 504. Based on the output of this comparison, the value of the data in the complementary cells is determined. For example, if the sampled value in sample and hold circuit 502 is the same as the subsequent value after writing a known value to the complementary cells, then it is determined that the data written to the memory cell for the second read is the same as the originally stored value. If, however, the comparator indicates a difference in the two read values, then the value stored in the memory cells is the opposite of the value written to the cells for the second read.

Figure 6:
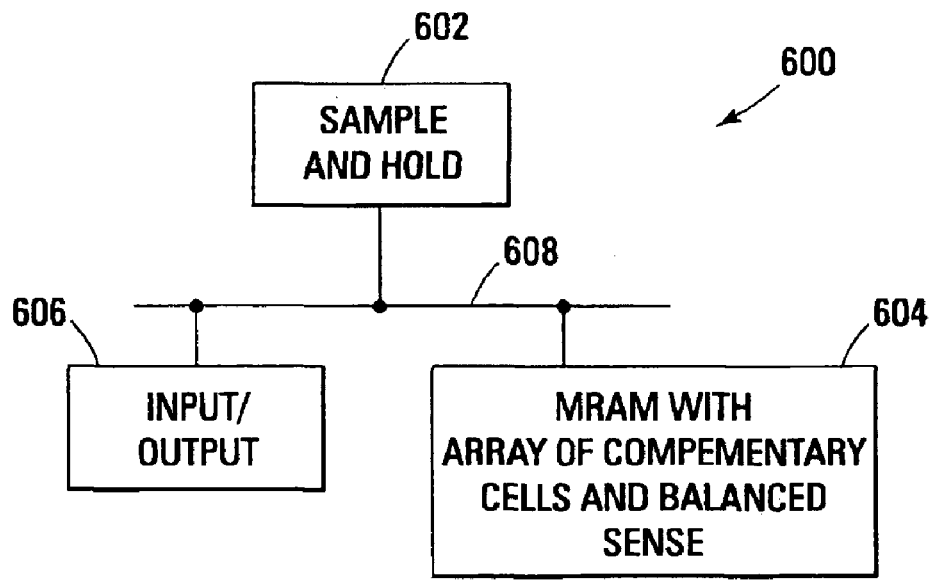
FIG. 6 is a block diagram of an electronic system with a memory having an array of complementary cells according to one embodiment of the present invention.

FIG. 6 is a block diagram of an electronic system, indicated generally at 600, with a magneto-resistive random access memory (MRAM) 604 having an array of complementary cells and balanced sense according to one embodiment of the present invention. In one embodiment, memory 604 is constructed as described above with respect to one or more of FIGS. 1–5. System 600 also includes processor 602, and input/output 606. Processor 602 comprises, for example, a microprocessor, a microcontroller, a controller, a programmable logic device, an application specific integrated circuit (ASIC) or other appropriate circuit for controlling the operation of system 600. Input/output device 606 includes, for example, a keyboard, mouse, touch screen, monitor, keypad, or other appropriate device for providing data to a user or receiving data from a user of system 600. Processor 602, memory 604 and input/output device 606 are coupled together, for example, over bus 608. Processor 602 is operable to execute instructions stored in memory 604. Further, processor 602 provides selected control signals to memory device 604 over bus 608 to control the operation of memory 604, e.g., control signals used in the storage and retrieval of data from memory 604.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the embodiments of the present invention described herein.

What is claimed is:

1. A magneto-resistive memory array, comprising:
    an array of magneto-resistive memory cells, the memory cells forming a plurality of rows and a plurality of columns;
    a plurality of sense lines having first and second ends, each sense line interconnecting a plurality of memory cells in a selected one of the rows in the plurality of rows of the array and providing a sense point located between the first and second ends of the sense line;
    a plurality of word lines, each word line passing adjacent to two, complementary memory cells in each row of the plurality of rows of the array; and
    a plurality of serpentine bit lines, each serpentine bit line disposed adjacent to the memory cells in one row of the array such that current flowing in the serpentine bit line passes in first and second, different directions for adjacent memory cells in the row.

2. The memory array of claim 1, wherein each sense line provides a voltage output at a midpoint of the sense line.

3. The memory array of claim 2, wherein each word line passes adjacent to the array of memory cells in a substantially U-shaped path.

4. The memory array of claim 2, wherein one memory cell of the two, complementary memory cells in a row associated with a common word line is located on a first side of the midpoint of the sense line and the other memory cell is located on the other side of the midpoint of the sense line.

5. The memory array of claim 1, wherein each serpentine bit line comprises:
    a plurality of first portions, the first portions extending parallel to the row of memory cells of the array;
    a plurality of second portions, each second portion disposed adjacent to one of the memory cells in the associated row of the array; and
    wherein each second portion is coupled to adjacent first portions such that current in the serpentine bit line flows in substantially opposite directions for adjacent memory cells in the row of the array.

6. The memory array of claim 1, and further including a sense circuit, the sense circuit comprising:
    a sample and hold circuit adapted to sample and hold a voltage from one of the plurality of sense lines; and
    a comparator, coupled to the one of the plurality of sense lines and the sample and hold circuit, the comparator adapted to determine the data stored in the complementary memory cells based on the sampled voltage and the voltage of the sense line.

7. A method for reading a value from a magneto-resistive memory device, the method comprising:
    reading a first voltage at a sense point of a sense line;
    driving a word line and a serpentine bit line with first and second currents, respectively, the first and second currents selected to set first and second memory cells on the sense line with complementary values, the first and second memory cells associated with the word line, the serpentine bit line, and the sense line;
    reading a second voltage at the sense point of the sense line;
    determining the value from the first and second voltages; and
    resetting the first and second memory cells to their original values.

8. The method of claim 7, wherein reading a first voltage at the sense point comprises:
    driving the sense line with a current; and
    reading a voltage at the sense point.

9. The method of claim 8, wherein determining the value comprises comparing the first and second voltages.

10. A method for storing data in first and second complementary cells of an array of magneto-resistive memory cells, the method comprising:
    driving a word line associated with the first and second cells with a first current; and
    driving a serpentine bit line associated with the first and second cells with a second current such that the first and second cells, located on opposite sides of a sense point of a sense line, are set to opposite states to store the data.

11. The method of claim 10, wherein driving the word line with a first current comprises driving the word line with a current that passes the first cell in a first direction and passes the second, complementary cell in a second, substantially different direction.

12. The method of claim 10, wherein driving the serpentine bit line with a second current comprises driving the serpentine word line with a current that passes the first cell in a first direction and passes the second, complementary cell in a second, substantially opposite direction.

13. A memory array for a magneto-resistive memory device, the array comprising:
   a plurality of memory cells disposed in rows and columns in the memory array;
   wherein each memory cell in each row is paired with another memory cell in the same row such that the pair of memory cells are driven to first and second, different states by applying a single set of signals; and
   a sense point for each row, the sense point located in the row at a point with one of the memory cells of each pair on one side of the sense point and the other memory cell of each pair located on the other side of the sense point.

14. The memory array of claim 13, and further comprising a plurality of word lines and a plurality of serpentine bit lines, the word lines and bit lines carrying the signals that drive the memory cells in a pair to opposite states.

15. A memory array for a magneto-resistive memory device, the array comprising:
   means for storing a plurality of data bits as pairs of complementary values;
   means for setting the pair of complementary values for a selected data bit in the means for storing using the same signals to store each of the complementary values in the pair of complementary values; and
   means for reading a data bit from the means for storing using selected complementary values in the means for storing.

16. The memory array of claim 15, wherein the means for storing comprises an array of magneto-resistive memory cells, each row of the array including a plurality of complementary pairs of memory cells.

17. The memory array of claim 15, wherein the means for storing comprises:
   an array of memory cells disposed in a plurality of rows and columns;
   a plurality of serpentine bit lines, the bit lines passing adjacent to each memory cell in a row of the array;
   a plurality of word lines, each word line passing adjacent to first and second complementary memory cells in each row of the array.

18. The memory array of claim 15, wherein the means for reading comprises a plurality of sense lines coupled to the means for storing for sensing the complementary values.

* * * * *